(12) United States Patent
Nakashima et al.

(10) Patent No.: US 6,864,515 B2
(45) Date of Patent: Mar. 8, 2005

(54) PRESSURE CONTACT TYPE SEMICONDUCTOR DEVICE HAVING DUMMY SEGMENT

(75) Inventors: Nobuhisa Nakashima, Tokyo (JP); Teruya Fukaura, Tokyo (JP); Kenji Oota, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/617,660

(22) Filed: Jul. 14, 2003

(65) Prior Publication Data

US 2004/0164316 A1 Aug. 26, 2004

(30) Foreign Application Priority Data

Feb. 25, 2003 (JP) ........................................ 2003-046872

(51) Int. Cl.[7] .............................................. H01L 31/111
(52) U.S. Cl. ........................ 257/107; 257/107; 257/718
(58) Field of Search ................................ 257/107, 718, 257/719, 727, 730, 785, 147, 150

(56) References Cited

U.S. PATENT DOCUMENTS 5,021,855 A * 6/1991 Oikawa et al. ............. 257/152
5,777,506 A   7/1998 Kurachi et al.

FOREIGN PATENT DOCUMENTS

| JP | 61-5533    | 1/1986  |
| JP | 62-7163    | 1/1987  |
| JP | 63-318161  | 12/1988 |
| JP | 3191653    | 5/2001  |

* cited by examiner

*Primary Examiner*—David Nelms
*Assistant Examiner*—Thinh T Nguyen
(74) *Attorney, Agent, or Firm*—Oblon, Spivak, McClelland, Maier & Neustadt, P.C.

(57) ABSTRACT

Each of outermost segments (OMSG) and innermost segments (IMSG) is utilized as a dummy segment. A top surface of a protruding portion (OMPP, IMPP) of each of the outermost segments (OMSG) and the innermost segments (IMSG) is covered with an insulating layer (1S+1P), and a clearance (CL) is provided between a top surface of the insulating layer (1S+1P) and a bottom surface (2BS) of a cathode strain relief plate. Each of all the other segments (SG) than the outermost and innermost segments has a protruding portion PP on which a cathode electrode (1K-AL) is formed. A thickness (T1) of the cathode electrode (1K-AL) is determined so as to allow a top surface of the cathode electrode (1K-AL) to be in contact with the bottom surface (2BS) of the cathode strain relief plate.

7 Claims, 12 Drawing Sheets

F I G . 1 4
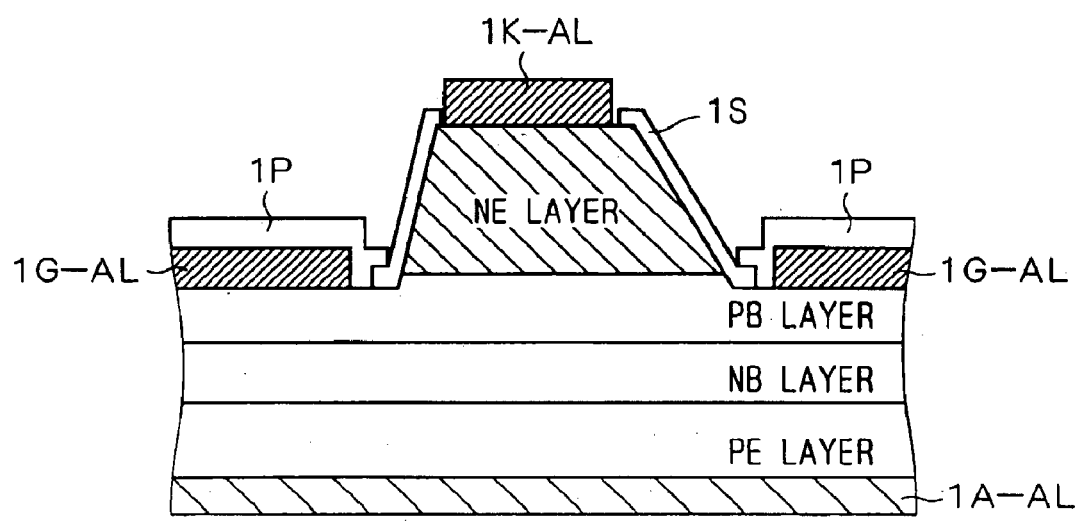

PRESSURE CONTACT TYPE SEMICONDUCTOR DEVICE HAVING DUMMY SEGMENT

BACKGROUND OF THE INVENTION

1. Field of the Invention

The present invention relates to a pressure contact type semiconductor device typified by a self-commutating thyristor such as a gate turn-off (GTO) thyristor or a gate commutated turn-off (GCT) thyristor, for example. More particularly, according to the present invention, a semiconductor substrate of the device includes at least one outermost segment and/or at least one innermost segment each functioning as a dummy segment. The present invention is applicable to a power device such as a BTB or SVG, for example. For industrial purposes, the present invention is applicable to an inverter for driving a steelmaking rolling machine. Further, the present invention is also applicable to a high voltage/large capacitance switch or the like.

2. Description of the Background Art

A basic structure of a GTO thyristor as one example of a pressure contact type semiconductor device is described in Japanese Patent Application Laid-Open Nos. 62-7163, 61-5533 and 63-318161, for example. According to Japanese Patent Application Laid-Open No. 62-7163, a silicon wafer serving as a semiconductor substrate of a GTO thyristor has a four-layer structure of a p-emitter layer, an n-base layer, a p-base layer and an n-emitter layer. The n-emitter layer is the uppermost layer and is formed of a number of segments each having an island-like protruding portion which are surrounded by the p-base layer.

A basic structure of a GCT thyristor is described in Japanese Patent No. 3191653 (hereinafter referred to as "JP 3191653"), for example. As described in this reference, a structure of a silicon wafer serving as a semiconductor substrate of a GCT thyristor is substantially identical to that of a GTO thyristor.

FIG. 9 is a view showing a profile of step heights of protruding portions of segments, which is obtained as a result of measurement on a semiconductor substrate of a pressure contact type semiconductor device having a conventional structure in an x-axis direction and a y-axis direction (it is noted that FIG. 9 is not admitted as prior art of the present invention). As shown in FIG. 9, the step heights vary such that: a step height at an inner side face of a protruding portion of each innermost segment is the smallest; a step height at a side face of each segment outer than each innermost segment is kept relatively large; and a step height at an outer side face of a protruding portion of each outermost segment is as small as that at the inner side face of each innermost segment. The inventors of the present invention suppose that the following factors are responsible for the foregoing variation in step height.

A typical method of forming a stepped structure on a main surface of a semiconductor substrate is wet etching employing a liquid mixture of a hydrofluoric acid or a nitric acid. In this regard, to perform wet etching on a silicon wafer with the whole of the silicon wafer being immersed in a liquid mixture would result in reduction of an etching rate, so that difference in concentration of the liquid mixture in a surface of the silicon wafer can responsively affect a step height to be created. Thus, uniformity in step height cannot be achieved. In view of this, it is necessary to increase an etching rate in order to perform etching so as to achieve uniformity in step height in accordance with a cathode segment pattern. In one attempt, a portion of a silicon wafer which is rotating is drawn out of a surface of a liquid mixture and is kept exposed to an oxygen atmosphere, thereby to involve oxygen in the form of a bubble into the liquid mixture, during etching. This accelerates reaction, to increase an etching rate.

However, a main surface of a semiconductor substrate generally includes an area reserved for formation of a pattern for extracting a gate electrode (gate electrode extraction pattern) for establishing contact between a gate electrode pattern in each segment and an external gate electrode. This area is located inner than each innermost segment or outer than each outermost segment and should be flat. For this reason, it is impossible to continuously hold bubbles 25 between segments to be sequentially etched, as demonstrated by FIG. 10 which schematically illustrates a state where etching is being carried out on a semiconductor substrate of a center gate type device (it is noted that FIG. 10 is not admitted as prior art of the present invent). As is illustrated in FIG. 10, each of the bubbles 25 which is involved in the vicinity of the flat area can not stop and is flown toward outer segments. As a result, an etching rate for each innermost segment is reduced.

FIG. 11 is a longitudinal sectional view of a semiconductor substrate which is manufactured in such a manner that an etching rate for innermost and outermost segments is reduced as compared to that for the other segments (it is noted that FIG. 11 is not admitted as prior art of the present invention). A portion surrounded by a circle "B" in FIG. 11 shows a structure of one innermost segment. FIG. 12 is an enlarged plan view of a protruding portion of the innermost segment in the portion "B" of FIG. 11, and FIG. 13 is an enlarged longitudinal sectional view of the innermost segment in the portion "B" of FIG. 11 (it is noted that FIGS. 12 and 13 are not admitted as prior art of the present invention). A portion surrounded by a circle "C" in FIG. 11 shows a structure of one outermost segment. As shown in FIGS. 11, 12 and 13, there is a gap in step height between opposite side faces of the protruding portion of the innermost segment, one of which side faces is located closer to a gate electrode extraction pattern, and between opposite side faces of a protruding portion of the outermost segment, one of which side faces is located closer to another gate electrode extraction pattern. It should be noted that in the structures shown in FIGS. 11, 12 and 13, a PN junction is not exposed in the side face of the protruding portion of each of the innermost segment and the outermost segment, which side face is located closer to the gate electrode pattern. Accordingly, an N-type emitter layer NE of the innermost or outermost segment on which a cathode electrode is to be formed extends to be located immediately under a pattern of a gate electrode 1G-AL which should be in contact with an external gate electrode 8. Such a situation is illustrated in a portion surrounded by a circle "D" in FIG. 13. Consequently, in a device having a gap in step height as described above, a cathode electrode and a gate electrode are short-circuited to each other.

Alternatively, depending on a degree of non-uniformity in etching for creating a step height, a stepped structure with a gap in step height as shown in FIG. 14 (it is noted that FIG. 14 is not admitted as prior art of the present invention) may be formed. In the structure shown in FIG. 14, a PN junction is located in the vicinity of a "valley" created between two adjacent protruding portions, which results in reduction of a breakdown voltage between a cathode electrode and a gate electrode.

One possible solution to the foregoing problems is to define a larger step height than a typical step height in etching for creating a step height. However, though this solution avoids reduction of a breakdown voltage or formation of a short circuit between a cathode electrode and a gate electrode, it produces another problem. Specifically, a step height created by each of protruding portions of the other segments than innermost and outermost segments is too large, so that it is very likely that a thickness of a P-type base layer PB is locally reduced. Such local reduction in thickness of the P-type base layer PB, if occurs, would significantly affect electrical characteristics, to degrade an operational performance of a GTO thyristor. Therefore, the foregoing solution is not entirely satisfactory.

Under the above-described circumstances, when a defective semiconductor substrate such as a substrate having the structure as shown in FIG. 11, 12, 13 or 14 is manufactured, to reject the defective semiconductor substrate, not employing it as a product, is one safe countermeasure for avoiding the foregoing problems. However, this countermeasure would suffer from decrease in yield due to rejection of defective semiconductor substrates in a process of quality inspection during manufacture.

SUMMARY OF THE INVENTION

It is an object of the present invention to provide a pressure contact type semiconductor device capable of achieving a stable operational performance without reduction of a breakdown voltage or formation of a short circuit even if a semiconductor substrate with a non-uniformly stepped structure which is likely to decrease yield is employed as a product.

According to the present invention, a pressure contact type semiconductor device includes a semiconductor substrate having a first main surface and a second main surface opposite to the first main surface, a first strain relief plate and a second strain relief plate. The first strain relief plate has a bottom surface which is in contact with the first main surface of the semiconductor substrate. The second strain relief plate has a top surface which is in contact with the second main surface of the semiconductor substrate.

The semiconductor substrate includes a first semiconductor layer of a first conductivity type, a second semiconductor layer of a second conductivity type, a third semiconductor layer of the first conductivity type and a second main electrode. The first semiconductor layer has a first bottom surface which forms the second main surface of the semiconductor substrate, and a first top surface opposite to the first bottom surface. The second semiconductor layer has a second bottom surface which includes an interface with the first top surface of the first semiconductor layer, and a second top surface opposite to the second bottom surface. The third semiconductor layer has a third bottom surface which includes an interface with the second top surface of the second semiconductor layer, and a third top surface opposite to the third bottom surface. The second main electrode is formed on the whole of the first bottom surface of the first semiconductor layer and is in direct mechanical contact with the top surface of the second strain relief plate.

Further, a plurality of protruding portions are arranged radially and circumferentially about the semiconductor substrate on the first main surface of the semiconductor substrate. Each of the plurality of protruding portions includes a fourth semiconductor layer of the second conductivity type.

The fourth semiconductor layer has a fourth bottom surface and a fourth top surface opposite to the fourth bottom surfaces. The fourth semiconductor layer has a fourth bottom surface and a fourth top surface opposite to the fourth bottom surface, the fourth bottom surface and a corresponding region out of the third top surface of the third semiconductor layer forming a pn junction. The fourth top surface forms a top surface of a corresponding one out of the plurality of protruding portions. The pn junction is located within the corresponding one of the plurality of the protruding portions. A top surface of each of first protruding portions belonging to at least one group out of a first group of outermost protruding portions and a second group of innermost protruding portions is entirely covered with a first insulating layer. The outermost protruding portions are located most outward in a radial direction out of the plurality of protruding portions. The innermost protruding portions are located most inward in the radial direction out of the plurality of protruding portions. A first clearance constantly exists between a top surface of the first insulating layer and a first region of the bottom surface of the first strain relief plate which is located immediately above the top surface of the first insulating layer.

A first main electrode is formed on a top surface of each of the plurality of protruding portions except the outermost protruding portions and the innermost protruding portions. The first main electrode is in direct mechanical contact with the bottom surface of the first strain relief plate.

The first main surface of the semiconductor substrate includes an exposed surface of the fourth semiconductor layer for each of the plurality of protruding portions and exposed regions of the third top surface.

A control electrode is formed as one pattern on a region of the first main surface in which no surface of the plurality of protruding portions is included.

In the pressure contact type semiconductor device according to the present invention, each of the innermost protruding portions or each of the outermost protruding portions and a portion of the insulating layer formed thereon is prevented from being brought into mechanical and electrical contact with the region of the bottom surface of the first strain relief plate which is located immediately above the insulating layer. As a result, it is possible to maintain a sufficient breakdown voltage of each of the pn junctions formed in each of the innermost protruding portions or each of the outermost protruding portions, to suppress a leakage current, without degrading an operational performance of the device.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 13 and 14 are enlarged longitudinal sectional views of the pressure contact type semiconductor device according to the background art, to clarify a problem associated therewith.

DESCRIPTION OF THE PREFERRED EMBODIMENTS

Outlines

In accordance with the conventional structure, a cathode electrode of each segment is in contact with a plate for relieving a strain put on the cathode electrode (hereinafter, referred to as a "cathode strain relief plate"), regardless of whether or not pressure contact is made. Also, a cathode electrode of each outermost or innermost segment of a semiconductor substrate located in the vicinity of a gate electrode extraction pattern which is formed in a portion outer than each outermost segment or a portion inner than each innermost segment is put to work. As such, when a step height created by a protruding portion of each innermost or outermost segment is not sufficiently large, a leakage current is likely to occur between a cathode electrode and a gate electrode. Such situation can be avoided by providing a structure in which each outermost and/or innermost segment (a segment located in the vicinity of a gate electrode extraction pattern) is not put to work, in other words, each outermost and/or innermost segment is formed as a dummy segment. Provision of this structure can prevent reduction of a breakdown voltage as well as occurrence of a leakage current.

A first specific approach for providing the foregoing structure is to use each outermost and/or innermost segment of a semiconductor substrate as a dummy pattern in etching. In this approach, a cathode electrode made of an aluminum film is not formed on a protruding portion of a dummy segment, so that the dummy segment will not come into contact with a cathode strain relief plate. This first approach corresponds to a first preferred embodiment of the present invention, which will be later described in detail.

A second specific approach is to utilize the semiconductor substrate having the conventional structure while structurally altering a cathode strain relief plate therein so as to prevent a cathode electrode of each outermost and/or innermost segment from coming into contact with the cathode strain relief plate. This second approach corresponds to a second or third preferred embodiment of the present invention, which will be later described in detail.

First Preferred Embodiment

Figure 1:
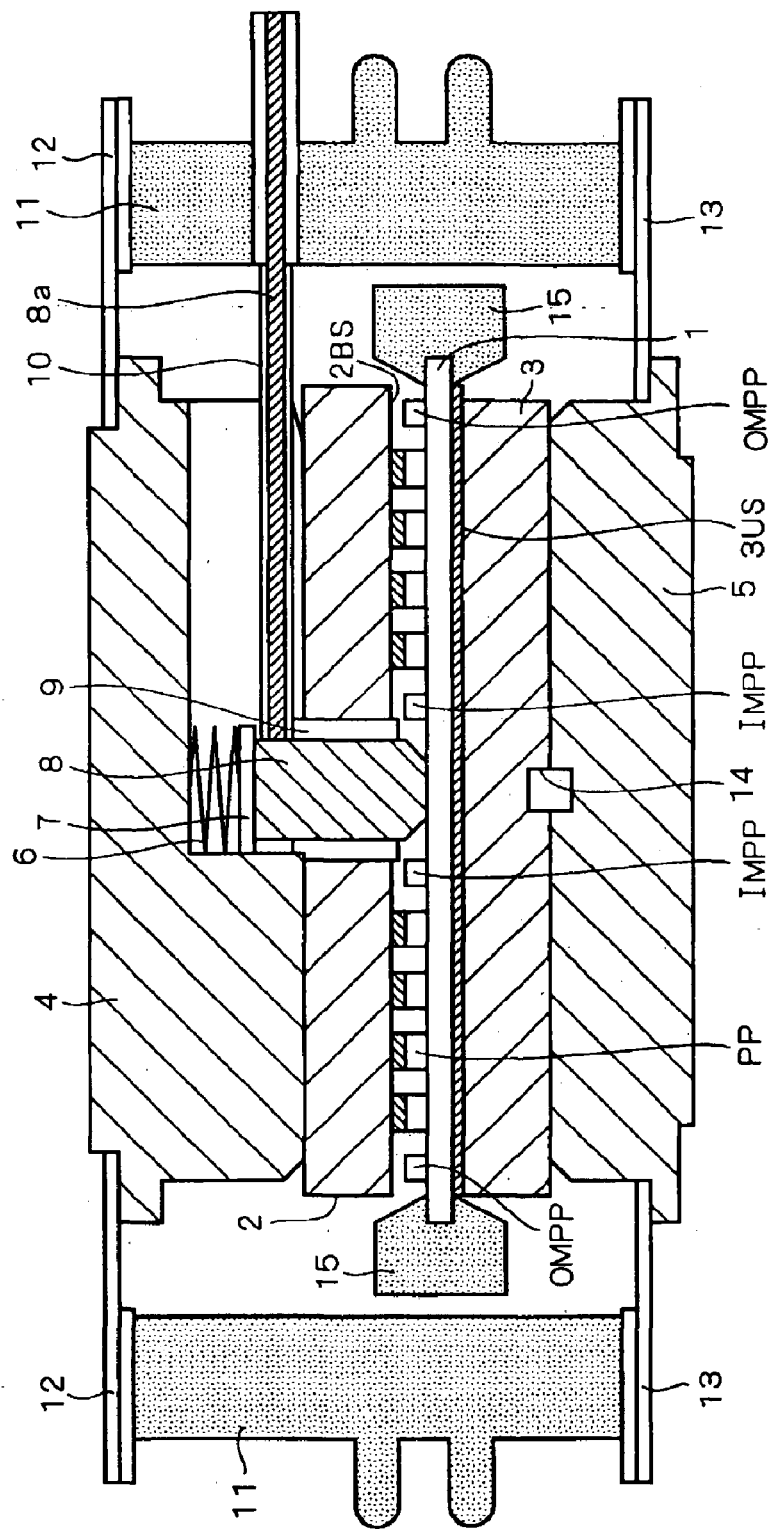
FIG. 1 is a longitudinal sectional view of a structure of a pressure contact type semiconductor device according to a first preferred embodiment of the present invention.
Figure 2:
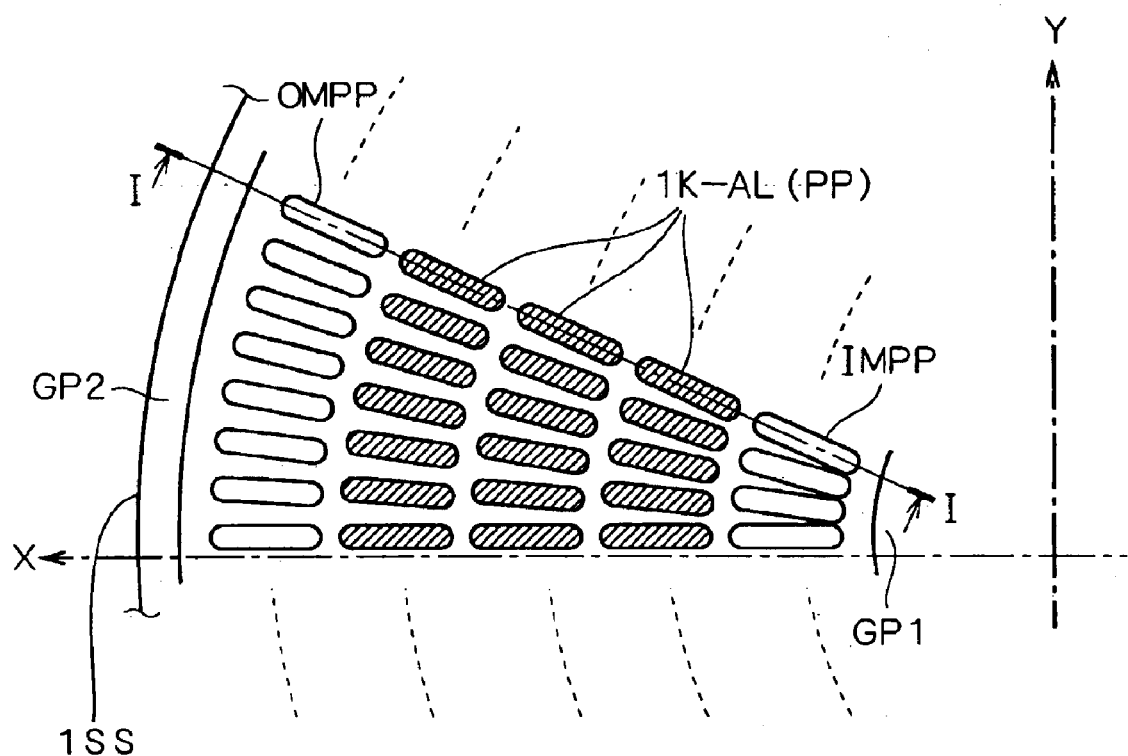
FIG. 2 is a plan view illustrating an arrangement pattern of NE layers and cathode electrodes of segments in the pressure contact type semiconductor device according to the first preferred embodiment of the present invention.
Figure 3:
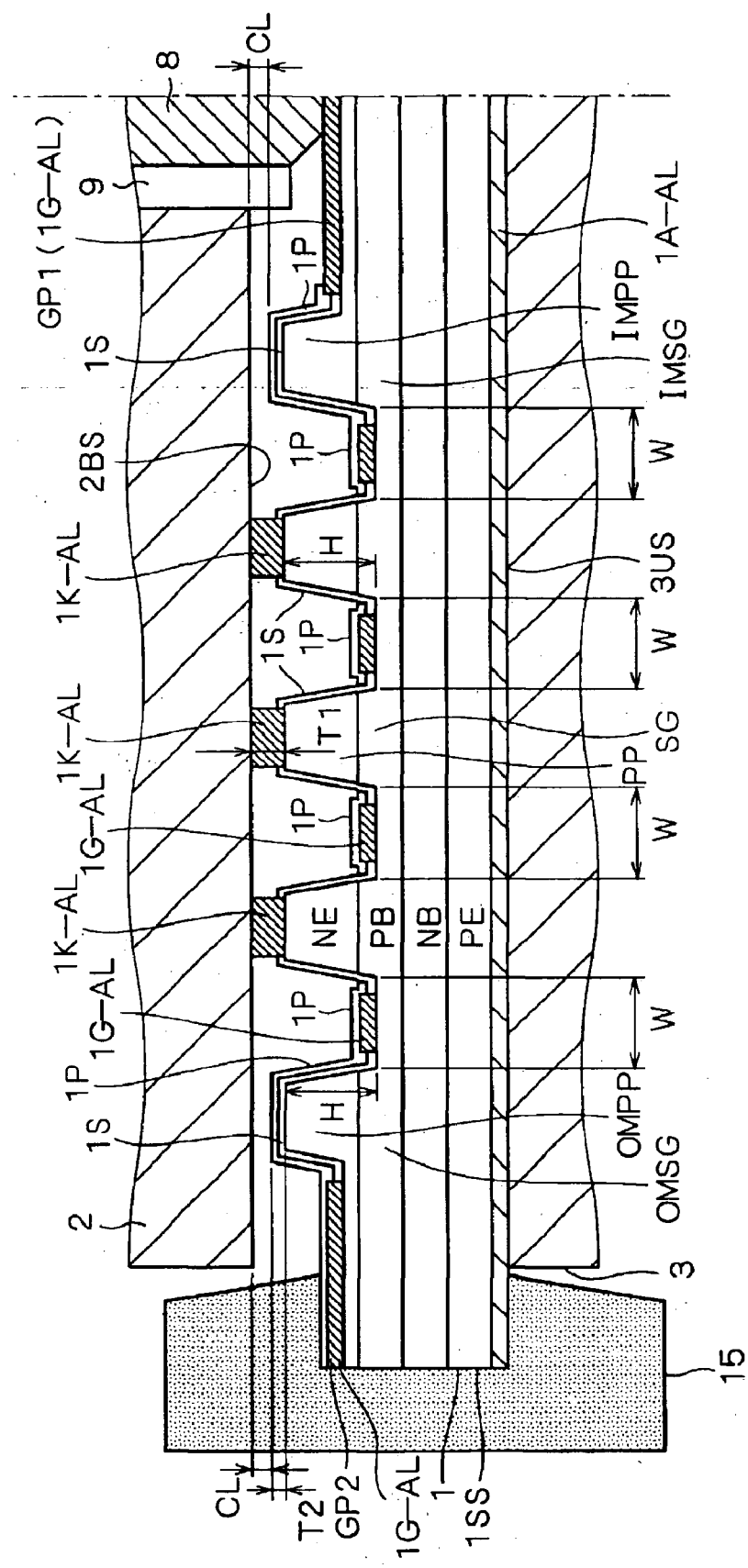
FIG. 3 is an enlarged longitudinal sectional view of a structure of a semiconductor substrate together with peripheral components of the pressure contact type semiconductor device according to the first preferred embodiment of the present invention.

FIG. 1 is a longitudinal sectional view of a structure of a pressure contact type semiconductor device according to the first preferred embodiment. In FIG. 1, a GTO thyristor of a center gate type is shown as a non-limiting example of the pressure contact type semiconductor device according to the first preferred embodiment. FIG. 2 is a plan view of a first main surface of a cylindrical semiconductor substrate 1 illustrated in FIG. 1. In FIG. 2, illustration of a gate electrode 1G-AL is omitted. It is noted that the first main surface is a top surface of the semiconductor substrate 1, which includes exposed regions of a third top surface of a third semiconductor layer (P-type base layer) PB and exposed surfaces of fourth semiconductor layers (N-type emitter layer) NE. The whole of a fourth bottom surface of each of the fourth semiconductor layers NE is contributed to formation of a PN junction between the third semiconductor layer PB and each of the fourth semiconductor layers NE as illustrated in FIG. 3. On the other hand, the semiconductor substrate 1 has a second main surface corresponding to an exposed bottom surface of a first semiconductor layer (P-type emitter layer) PE. FIG. 3 is a sectional view of the semiconductor substrate 1 together with peripheral components, taken along a line I—I in FIG. 2. FIG. 3 is particularly directed to a situation where a step height created by each of one outermost segment OMSG and one innermost segment IMSG is made smaller than a step height created by each of other segments SG during manufacture of the semiconductor substrate 1. However, even if the foregoing situation does not occur, respective basic structures of each outermost segment OMSG and each innermost segment IMSG are as illustrated in FIG. 3, of course. FIG. 3 illustrates one of two parts which are symmetric about a broken line in FIG. 3. Additionally, details of the above-noted elements (the gate electrode 1G-AL, and the first, third and fourth semiconductor layers) will be later provided.

As is illustrated in FIGS. 1 and 3, a cathode strain relief plate (metal plate) 2 is provided, which is annular and made of molybdenum, for example. The cathode strain relief plate 2 has a bottom surface 2BS which is in mechanical contact with each of cathode electrodes 1K-AL formed on respective regions of the first main surface of the semiconductor substrate 1. The cathode strain relief plate 2 can come into electrical contact with each of the cathode electrodes 1K-AL during pressure contact (i.e., when they are placed in pressure contact with each other). The whole of a bottom surface of an external cathode electrode 4 is in mechanical contact with a top surface of the cathode strain relief plate 2 which is opposite to the bottom surface 2BS. The external cathode electrode 4 can come into electrical contact with the cathode strain relief plate 2 during pressure contact. In contrast, a top surface of the external cathode electrode 4 is exposed.

An anode strain relief plate 3 is cylindrical and made of molybdenum, for example. The anode strain relief plate 3 has a top surface 3US which is in mechanical contact with an anode electrode 1A-AL formed so as to extend over the second main surface of the semiconductor substrate 1. The anode strain relief plate 3 can come into electrical contact with the anode electrode 1A-AL during pressure contact. The whole of a top surface of an external anode electrode 5 is in mechanical contact with a bottom surface of the anode strain relief plate 3 which is opposite to the top surface 3US. The external anode electrode 5 can come into electrical contact with the anode strain relief plate 3 during pressure contact. In contrast, a bottom surface of the external anode electrode 5 is exposed. Further, grooves are formed in respective central regions of the bottom surface of the anode strain relief plate 3 and the top surface of the external anode electrode 5 so as to oppose each other. The grooves form a pin 14 used for aligning the anode strain relief plate 3 and the external anode electrode 5 with each other.

An external gate electrode 8 which is substantially cylindrical and surrounded by an annular insulating supporting tube 9 for aligning the external gate electrode 8 is provided in a space formed of a through hole in a central portion of the cathode strain relief plate 2 and a hollow portion of the external cathode electrode 4. A bottom surface of the external gate electrode 8 is in mechanical contact with one pattern of a gate electrode 1G-AL which is formed on a central region of the first main surface of the semiconductor substrate 1 (corresponding to a top surface of a central portion of the semiconductor substrate 1 where no segment SG is formed). The one pattern of the gate electrode 1G-AL will be referred to as a "gate electrode extraction pattern GP1". The external gate electrode 8 can come into electrical contact with a (first) gate electrode extraction pattern GP1 during pressure contact. Further, an elastic spring 6 for inwardly pressing the external gate electrode 8 and a mica washer 7 having an insulating property are provided between a top surface of the external gate electrode 8 and one surface of the external cathode electrode 4 which defines a ceiling of the hollow portion of the external cathode electrode 4. Moreover, a gate lead line 8a for establishing conduction of the external gate electrode 8 to the outside is jointed to an upper region of a side face of the external gate electrode 8. The gate lead line 8a is surrounded by a gate sleeve 10 for insulating the gate lead line 8a.

A first flange 12 is provided such that an inner surface thereof is secured to an upper region of a side face of the external cathode electrode 4, and likewise a second flange 13 is provided such that an inner surface thereof is secured to a lower region of a side face of the external anode electrode 5. Further, an insulating tube 11 made of ceramic, for example, is provided between the first flange 12 and the second flange 13 while being attached to the flanges. Because of provision of the insulating tube 11, a sealed structure including components denoted by reference numerals "1", "2", "3", "6", "7", "8", "9", "10" and "15" is formed. An air within the sealed structure is substituted with an inert gas. Additionally, an insulating protective material 15 is provided for maintaining breakdown characteristics of an end surface of the semiconductor substrate 1.

In operations of the GTO thyristor with the foregoing structure, the external cathode electrode 4 and the external anode electrode 5 are placed in pressure contact with each other by application of some external force. This brings the cathode electrodes 1K-AL on the semiconductor substrate 1, the cathode strain relief plate 2 and the external cathode electrode 4 into electrical contact with one another, as well as brings the anode electrodes 1A-AL, the anode strain relief plate 3 and the external anode electrode 5 into electrical contact with one another. At the same time, the external gate electrode 8 is connected with the gate electrode extraction pattern GP1 by the spring 6, to electrically contact the gate electrode extraction pattern GP1. This makes the semiconductor substrate 1 conductive. By flowing a current across the external gate electrode 8 and the external cathode electrode 4 in the GTO thyristor placed in the foregoing state, a main current flowing between each of the cathode electrodes 1K-AL and the anode electrode 1A-AL is electrically controlled.

Significant features of the first preferred embodiment lie in a structure of the semiconductor substrate 1 formed mainly of a silicon wafer, out of the above-described components. For the other components including interior components and exterior components, conventional components can be employed. Hence, below, details of the structure of the semiconductor substrate 1 will be provided with reference to FIGS. 2 and 3. It is noted that though each of FIGS. 2 and 3 shows an example where three active segments each capable of performing a required function (i.e., all the segments SG except outermost and innermost segments OMSG and IMSG) are arranged in each radial direction, for purposes of illustration, the first preferred embodiment should not be limited to such example. The number of the active segments SG arranged in each radial direction is arbitrary.

The semiconductor substrate 1 has a PNPN structure, and is applicable to both a center gate type device and a periphery gate type device. Specifically, the semiconductor substrate 1 includes: (1) a first semiconductor layer (P-type emitter layer) PE formed by doping a P-type impurity (a first conductivity type impurity) into a silicon substrate; (2) a second semiconductor layer (N-type base layer) NB which is formed on the whole of a first top surface of the first semiconductor layer PE and contains an N-type impurity (a second conductivity type impurity); (3) a third semiconductor layer (P-type base layer) PB which is formed on the whole of a second top surface of the second semiconductor layer NB and contains a P-type impurity; and (4) a plurality of fourth semiconductor layers (N-type emitter layer) NE each of which is formed on a region of a third top surface of the third semiconductor layer PB and contains an N-type impurity. The gate electrode extraction pattern GP1 used in a center gate type device is formed on the first main surface in a central portion of the semiconductor substrate 1, and a gate electrode extraction pattern GP2 used in a periphery gate type device is formed on the first main surface in a peripheral portion of the semiconductor substrate 1. Then, a plurality of mesa structures, i.e., a plurality of protruding portions PP each shaped like an island, are arranged radially and circumferentially about a circumference of the semiconductor substrate 1 in a portion between the central portion and the peripheral portion of the semiconductor substrate 1. A pitch between every two adjacent ones of the protruding portions PP in each radial direction is a predetermined distance W. Each of the protruding portions PP includes a portion of the third semiconductor layer PB and one of the fourth semiconductor layers NE. In other words, the fourth semiconductor layers NE are entirely contained in all the protruding portions PP except outermost and innermost protruding portions OMPP and IMPP, respectively. The outermost protruding portions OMPP are defined as circumferential protruding portions which are located most outward in a radial direction out of all the protruding portions PP. In contrast, the innermost protruding portions IMPP are defined as circumferential protruding portions which are located most inward in the radial direction out of all the protruding portions PP. In this manner, a step height H is created between each of the cathode electrodes 1K-AL and the gate electrode 1G-AL by each of the protruding portions PP. Provision of the step height H maintains a breakdown voltage of a PN junction which is located between each of the cathode electrodes 1K-AL and the gate electrode 1G-AL at a sufficient level. Further, a passivation film 1S (an insulating film made of silicon oxide, for example) for protecting the PN junction between the third semiconductor layer PB and each of the fourth semiconductor layers NE while keeping it clean is formed on the whole of a side face of each of the protruding portions PP. The passivation film 1S functions to stabilize part of the PN junction which is exposed at the side faces of the respective protruding portions PP except a (second) portion of a side face of each outermost protruding portion OMPP located closer to the gate electrode extraction pattern GP2 and a (first) portion of a side face of each innermost protruding portion IMPP located closer to the gate electrode extraction pattern GP1. Moreover, one pattern of the gate electrode 1G-AL made of an aluminum film, for example, is formed on each valley between every two adjacent ones of the protruding portions PP, a region outer than each outermost protruding portion OMPP and a region inner than each innermost protruding portion IMPP which are included in the first main surface of the semiconductor substrate 1. The portions of the gate electrode 1G-AL consisting essentially of the one pattern, which are formed on the region inner than each innermost protruding portion IMPP and the region outer than each outermost protruding portion OMPP, correspond to the (first and second) gate electrode extraction patterns GP1 and GP2, respectively. An entire surface of the gate electrode 1G-AL except the first gate electrode extraction pattern GP1 is covered with an insulating film 1P made of polyimide, for example. The insulating film 1P is connected with the passivation film 1S.

The first bottom surface of the first semiconductor layer PE forms the second main surface of the semiconductor substrate 1 as noted above. The anode electrode 1A-AL made of an aluminum film, for example, is formed on the whole of the first bottom surface of the first semiconductor layer PE.

As described above, each of the plurality of segments SG arranged radially and circumferentially about the semiconductor substrate 1 includes respective portions of the first, second and third semiconductor layers PE, NE and PB and one of the fourth semiconductor layer NE. Each of the outermost segments OMSG and the innermost segments IMSG out of all the segments SG functions as a dummy segment. Below, a structure of each of the outermost and innermost segments OMSG and IMSG, which constitutes the significant features of the first preferred embodiment, will be described in detail, as contrasted with a structure of each of the other segments (active segments) SG, with reference to FIG. 3.

First, the cathode electrode 1K-AL is not formed on a top surface of the outermost protruding portion OMPP in the outermost segment OMSG at all. Instead, the top surface of the outermost protruding portion OMPP is entirely covered with the passivation film 1S which also covers the side face of the outermost protruding portion OMPP and the insulating film 1P formed on the passivation film 1S. It is noted that hereinafter, a layer composed of the passivation film 1S and the insulating film 1P will be collectively referred to as an "insulating layer". Likewise, a top surface of the innermost protruding portion IMPP in the innermost segment IMSG is entirely covered with the insulating layer composed of the passivation film 1S and the insulating film 1P. In contrast thereto, the cathode electrodes 1K-AL are formed on respective top surfaces of the protruding portions PP in the other segments SG. A thickness T1 of each of the cathode electrodes 1K-AL is greater than a thickness T2 of the insulating layer (1S+1P) formed on the top surface of each of the outermost protruding portion OMPP and the innermost protruding portion IMPP (T1>T2). Each of all the protruding portions PP including the outermost and innermost protruding portions OMPP and IMPP has a height "H" relative to the valley or part of the top surface of the third semiconductor layer PB which is located between every two adjacent ones of the protruding portions PP. Accordingly, a height (H+T2) from the valley to the top surface of the insulating layer (1S+1P) is smaller than a height (H+T1) from the valley to the top surface of each of the cathode electrodes 1K-AL. As a result, the top surface of each of the cathode electrodes 1K-AL respectively formed on all the protruding portions PP except the outermost and innermost protruding portions OMPP and IMPP is in mechanical contact with the bottom surface 2BS of the cathode strain relief plate 2 when no pressure contact is made. In contrast, a clearance CL which can not be physically bridged exists between the top surface of the insulating layer (1S+1P) on each of the outermost and innermost protruding portions OMPP and IMPP and a region of the bottom surface 2BS of the cathode strain relief plate 2 which is located immediately above the top surface of the insulating layer. Because of existence of the clearance CL, the top surface of the insulating layer (1S+1P) on each of the outermost and innermost protruding portions OMPP and IMPP is prevented from mechanically contacting the bottom surface 2BS of the cathode strain relief plate 2. Even during pressure contact, the top surface of the insulating layer (1S+1P) on each of the outermost and innermost protruding portions OMPP and IMPP does not come into mechanical nor electrical contact with the bottom surface 2BS, of course. Additionally, the height H of each of the segments SG is 30 $\mu$m, the thickness T1 of each of the cathode electrodes 1K-AL is 10 $\mu$m, the thickness of the passivation film 1S is 2 $\mu$m, and the thickness of the insulating film 1P is 3 $\mu$m, for example. Assuming that the above-noted specific values are employed, the height (H+T2) is 35 $\mu$m and the height (H+T1) is 40 $\mu$m, so that the clearance CL is 5 $\mu$m.

A method of manufacturing the semiconductor substrate 1 as illustrated in FIG. 3 is substantially identical to the conventional method of manufacturing a semiconductor substrate except that photolithography is carried out by using a special mask which includes no pattern for the outermost and innermost protruding portions OMPP and IMPP. As such, neither additional manufacturing apparatus nor additional manufacturing step is required.

Thus, each of the outermost and innermost segments OMSG and IMSG is disposed as a dummy segment. Hence, even if a step height created by the outer side face of any outermost segment OMSG or the inner side face of any innermost segment IMSG is relatively small, reduction of a breakdown voltage, as well as formation of a short circuit, between each of the cathode electrodes 1K-AL and the gate electrode 1G-AL can be prevented. Accordingly, it is possible to prevent a leakage current from occurring due to a gap in step height, thereby to achieve excellent electrical characteristics in an operating condition without any problem. In other words, the semiconductor substrate 1 with the above-described structure can be employed as a product, which provides for dramatic improvement in manufacturing yield.

Figure 4:
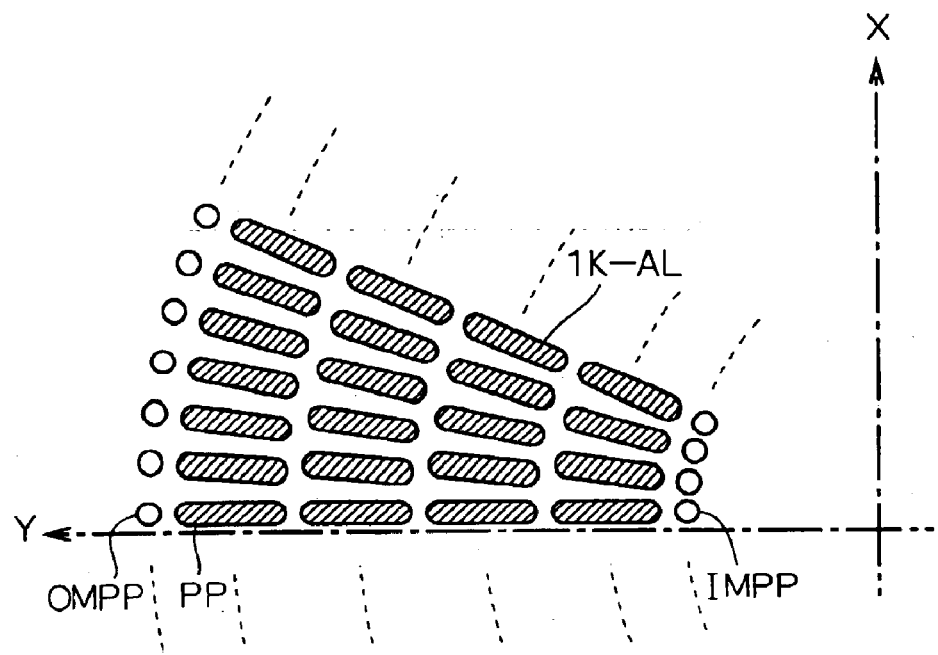
FIG. 4 is a plan view illustrating an arrangement pattern of NE layers and cathode electrodes of segments in a pressure contact type semiconductor device according to a first modification of the present invention.

Alternatively, the above-described structural features according to the first preferred embodiment may be applied to a GTO thyristor of a periphery gate type (a device having a structure shown in FIG. 18 of JP 3191653, for example) or a GCT thyristor (a device having a structure shown in FIG. 4 of JP 3191653, for example).

Further, as an alternative to the structure illustrated in FIGS. 1, 2 and 3, a structure in which only each outermost segment OMSG or only each innermost segment IMSG is formed as a dummy segment in the above-described manner may be provided. For example, in a center gate type GTO thyristor, a gate electrode extraction pattern which is in contact with the external gate electrode 8 should be formed on a central region of a top surface of a semiconductor substrate. In such a structure, influence of a leakage current is more serious when it occurs in the vicinity of each innermost segment IMSG. Thus, it is supposed to form only each innermost segment IMSG as a dummy segment. In this case, an advantage of reliably preventing reduction of a breakdown voltage or formation of a short circuit in the vicinity of each innermost segment IMSG can be produced. On the other hand, in the periphery gate type GTO thyristor or the GCT thyristor, a gate electrode extraction pattern which is in contact with the external gate electrode 8 should be formed on a peripheral region of a top surface of a semiconductor substrate. In such a structure, influence of a leakage current is more serious when it occurs in the vicinity of each outermost segment OMSG, so that it is supposed to form only each outermost segment OMSG as a dummy segment. In this case, an advantage of reliably preventing reduction of a breakdown voltage or formation of a short circuit in the vicinity of each outermost segment OMSG can be produced.

Next, modifications of the first referred embodiment will be described with reference to accompanying drawings. According to those modifications, briefly, a shape of each of the outermost and innermost protruding portions OMPP and IMPP on which the cathode electrode 1K-AL is not formed is made different from a shape of the other protruding portions PP on which the cathode electrodes 1K-AL are respectively formed.

First Modification

Referring to an arrangement pattern of the cathode electrodes as illustrated in FIG. 4, an area of each of the outermost and innermost protruding portions OMPP and IMPP in the dummy segments is determined to be smaller than an area of each of the other protruding portions PP.

This makes it possible to increase an area of each of the other operational segments (non-dummy segments or active segments). Accordingly, a contact area between each of the cathode electrodes 1K-AL and the bottom surface 2BS of the cathode strain relief plate 2 can be maximized.

Alternatively, an area of only each outermost protruding portion OMPP or only each innermost protruding portion IMPP may be made smaller than an area of each of the other protruding portions PP.

Second Modification

Figure 5:
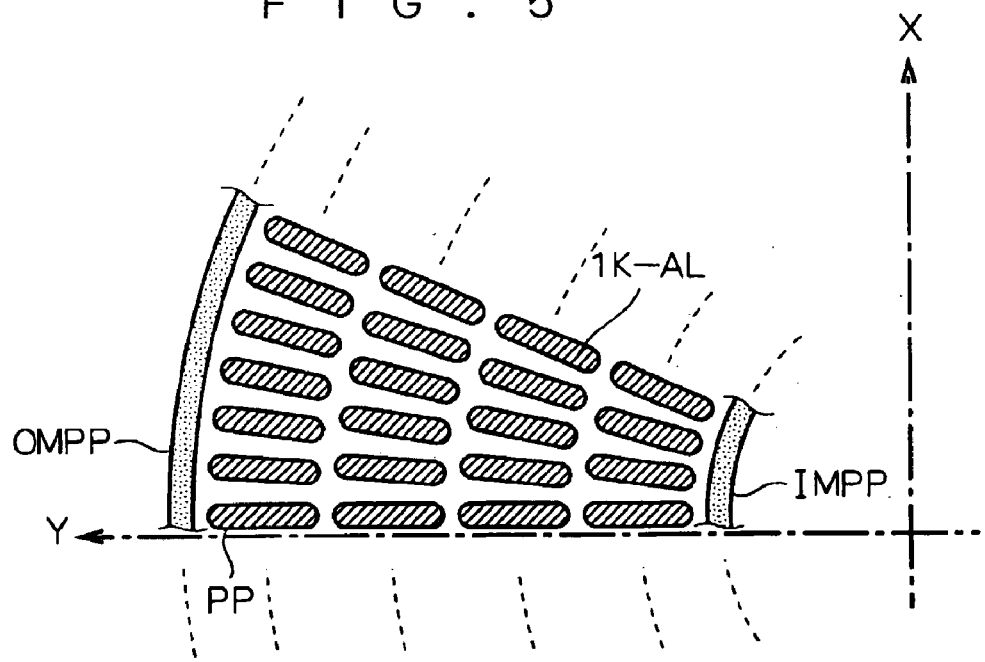
FIG. 5 is a plan view illustrating an arrangement pattern of NE layers and cathode electrodes of segments in a pressure contact type semiconductor device according to a second modification of the present invention.

Referring to an arrangement pattern of the cathode electrodes as illustrated in FIG. 5, respective shapes of the outermost protruding portions OMPP in the dummy segments are determined to be continuous with one another so as to form a single ring, and respective shapes of the innermost protruding portions IMPP in the dummy segments are determined to be continuous with one another so as to form another single ring.

By employing a single ring-shaped protruding portion formed of protruding portions which are arranged continuously with one another along an entire circumference of a semiconductor substrate, it is possible to suppress photographic defects possibly caused during photolithography (pin holes or variation in thickness of resist). Also, each of a single ring-shaped protruding portion formed of the outermost protruding portions OMPP and a single ring-shaped protruding portion formed of the innermost protruding portions IMPP can function as a barrier wall for preventing a foreign substance with a size no less than the clearance CL from entering into the cathode electrodes 1K-AL and the patterns of the gate electrode 1G-AL. This makes it possible to completely prevent characteristics provided between each of the cathode electrodes 1K-AL and the gate electrode 1G-AL from being degraded due to entering of the foreign substance (formation of a short circuit, for example).

Alternatively, only the outermost protruding portions OMPP or only the innermost protruding portions IMPP may be shaped to form a single continuous ring.

Further alternatively, at least the outermost protruding portions OMPP or at least the innermost protruding portions IMPP may be formed as a plurality of protruding portions which are periodically arranged to form a single broken ring, though such configuration may lessen the above-noted effects.

Second Preferred Embodiment

According to the second preferred embodiment, the same effects attained in the first preferred embodiment are attained by structurally altering one of interior components used in a semiconductor device while utilizing a semiconductor substrate having the conventional structure (in which the cathode electrode 1K-AL is formed on a top surface of each of the outermost and innermost protruding portions OMPP and IMPP) so as to allow each of the outermost and innermost segments to function as a dummy segment. Such an interior component to be structurally altered is a cathode strain relief plate alone, in the second preferred embodiment. The second preferred embodiment may be advantageous over the third preferred embodiment which will be later described in detail (briefly, in the third preferred embodiment, there is a need of substituting the supporting tube 9, the spring 6, the mica washer 7 and the external gate electrode 8 each having the conventional dimensions with components having special dimensions different from the conventional dimensions, respectively) in that a cathode strain relief plate is the only component to be altered. Specifically, according to the second preferred embodiment, a missing portion is provided in a lower corner portion of an outer peripheral surface and/or an internal circumferential surface of a cathode strain relief plate (which has an outer diameter and an inner diameter equal to those in the conventional cathode strain relief plate, respectively), thereby to prevent the cathode electrode 1K-AL on a top surface of each outermost protruding portion OMPP and/or on a top surface of each innermost protruding portion IMPP from being brought into mechanical and electrical contact with a bottom surface of the cathode strain relief plate during pressure contact. Below, such a structure of a cathode strain relief plate, which constitutes significant features of the second preferred embodiment, will be mainly described in detail, with reference to accompanying drawings.

Figure 6:
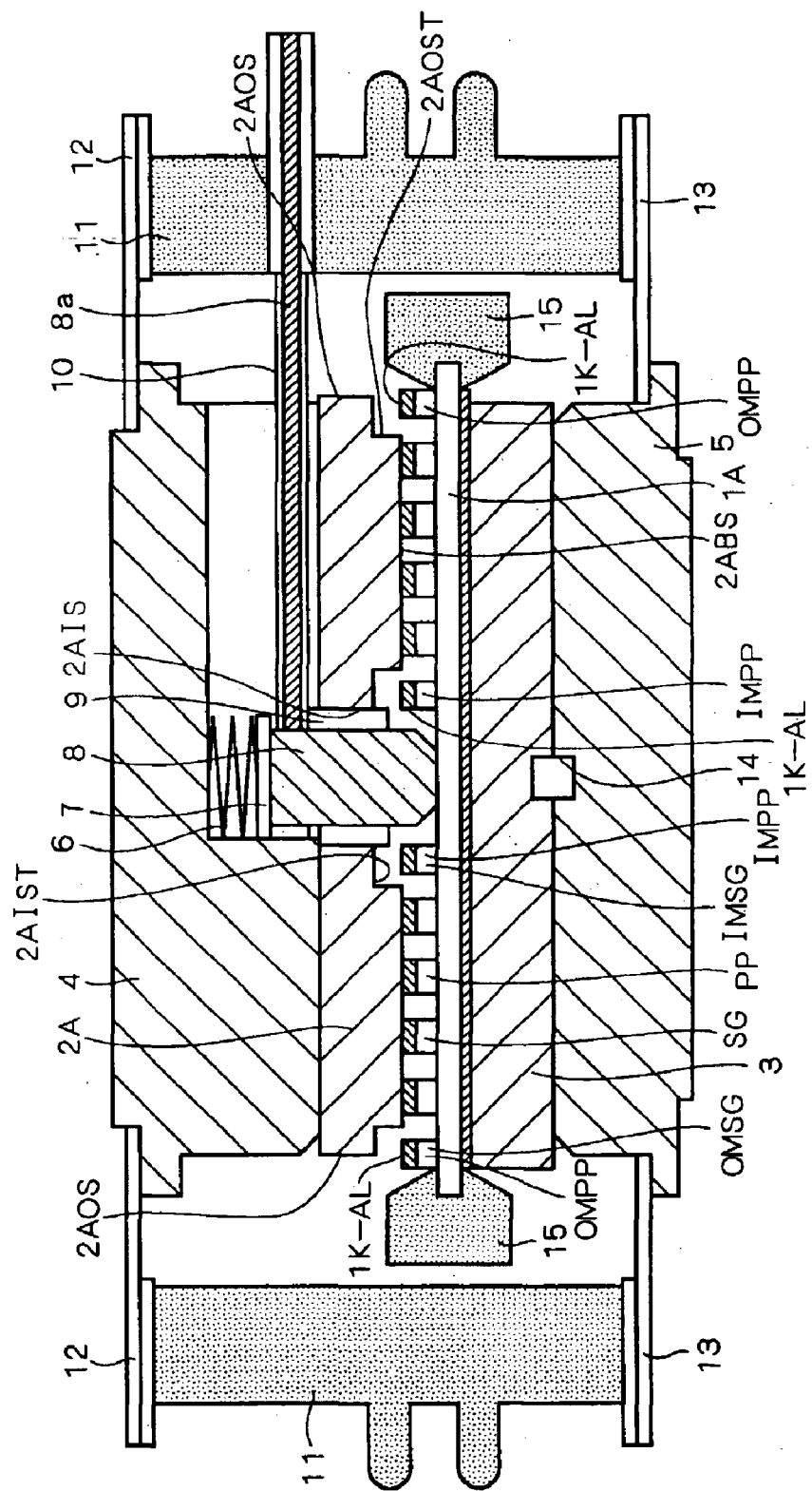
FIG. 6 is a longitudinal sectional view of a structure of a pressure contact type semiconductor device according to a second preferred embodiment of the present invention.

FIG. 6 is a longitudinal sectional view of a structure of a pressure contact type semiconductor device according to the second preferred embodiment. In FIG. 6, similarly to FIG. 1, a GTO thyristor of a center gate type device is shown as a non-limiting example of the pressure contact type semiconductor device according to the second preferred embodiment. It is noted that each component in FIG. 6 which corresponds to any one of the components in FIG. 1 is denoted by the same reference numeral, and an appropriate portion in the description of the first preferred embodiment should be referred to, for detail of such element.

As illustrated in FIG. 6, the cathode electrode 1K-AL made of an aluminum film is formed on a top surface of each of the protruding portions PP in all the respective segments SG in a semiconductor substrate 1A. In contrast thereto, a missing portion 2AOST having a step-like shape is provided in a corner portion (first corner portion) at which an outer peripheral surface 2AOS of a cathode strain relief plate 2A being an annular member and a bottom surface 2ABS thereof meet each other. As a result of provision of the missing portion, the outer stepped portion 2AOST is provided in the cathode strain relief plate 2A. Moreover, a shape and dimensions of the outer (first) stepped portion 2AOST is determined so as to prevent the outer stepped portion 2AOST from being brought into mechanical and electrical contact with the cathode electrode 1K-AL on a top surface of each outermost protruding portion OMPP, regardless of whether or not pressure contact is made. For example, it is designed such that a line of intersection of a side face of the outer stepped portion 2AOST and the bottom surface 2ABS is located between the cathode electrode 1K-AL on a top surface of each outermost protruding portion OMPP and the cathode electrode 1K-AL on a top surface of each of the protruding portions PP respectively disposed adjacent to the outermost protruding portions OMPP. (Alternatively, it may be designed such that the foregoing line of intersection is located immediately above the cathode electrode 1K-AL on a top surface of each of the protruding portions PP respectively disposed adjacent to the outermost protruding portions OMPP.) Accordingly, a (first) clearance constantly exists between each of the cathode electrodes 1K-AL respectively formed on the outermost protruding portions OMPP and the outer stepped portion 2AOST located immediately thereabove. The cathode strain relief plate 2A further has another missing portion 2AIST provided in a corner portion (second corner portion) at which the bottom surface 2ABS and an inner peripheral surface 2AIS of the cathode strain relief plate 2A meet each other. As a result of provision of this missing portion, an inner stepped portion 2AIST is provided in the cathode strain relief plate 2A. A shape and dimensions of the inner (second) stepped portion 2AIST is determined so as to prevent the inner stepped portion 2AIST from being brought into mechanical and electrical contact with the cathode electrode 1K-AL on a top surface of each innermost protruding portion IMPP, regardless of whether or not pressure contact is made. For example, it is designed such that a line of intersection of a side face of the inner stepped portion 2AIST and the bottom surface 2ABS is located between the cathode electrode 1K-AL on a top surface of each innermost protruding portion IMPP and the cathode electrode 1K-AL on a top surface of each of the protruding portions PP respectively disposed adjacent to the innermost protruding portions IMPP. (Alternatively, it may be designed such that the foregoing line of intersection is located immediately above the cathode electrode 1K-AL on a top surface of each of the protruding portions PP respectively disposed adjacent to the innermost protruding portions IMPP.) Accordingly, a (second) clearance constantly exists between each of the cathode electrodes 1K-AL respectively formed on the innermost protruding portions IMPP and the inner stepped portion 2AIST located immediately thereabove.

Given the cathode strain relief plate 2A including the outer and inner (first and second) stepped portions 2AOST and 2AIST, it is possible to prevent the respective cathode electrodes 1K-AL on the outermost protruding portions OMPP and the innermost protruding portions IMPP from being brought into mechanical and electrical contact with the bottom surface 2ABS of the cathode strain relief plate 2A during pressure contact. Hence, even if a step height created by any outermost segment OMSG or any innermost segment IMSG is made smaller than a step height by any other segment SG during manufacture of the semiconductor substrate 1A, it is possible to employ the semiconductor substrate 1A as a product and to prevent the respective cathode electrodes 1K-AL on the outermost protruding portions OMPP and the innermost protruding portions IMPP from being brought into contact with the cathode strain relief plate 2A while the cathode electrode 1K-AL is formed on each of all the protruding portions PP including the outermost and innermost protruding portions OMPP and IMPP. In the semiconductor substrate 1A, each of the outermost and innermost segments OMSG and IMSG merely functions as a dummy segment though each segment (OMSG, IMSG) has the cathode electrode 1K-AL formed thereon. Accordingly, the pressure contact type semiconductor device illustrated in FIG. 6 produces the same effects as is produced by the device according to the first preferred embodiment, in operating conditions. Particularly, the cathode strain relief plate 2A according to the second preferred embodiment can be formed by only altering the conventional cathode relief plate in such a simple manner that the outer and inner (first and second) stepped portions 2AOST and 2AIST are provided therein, without changing the outer diameter and the inner diameter thereof. Thus, the second preferred embodiment is advantageous in that the conventional components can be employed for the other components.

As an alternative to the structure illustrated in FIG. 6, a missing portion may be provided in only one of the lower corner portions respectively associated with the outer peripheral surface 2AOS and the inner peripheral surface 2AIS of the cathode strain relief plate 2A to provide the stepped portion.

Further, the above-described structural features according to the second preferred embodiment may be applied to a GTO thyristor of a periphery gate type (a device having a structure shown in FIG. 18 of JP 3191653, for example), or a GCT thyristor (a device having a structure shown in FIG. 4 of JP 3191653, for example). It should be noted, however, that a cathode strain relief plate in each of the devices shown in FIGS. 4 and 18 of JP 3191653 is normally cylindrical, so that an inner surface cannot exist. Accordingly, in application to the device shown in FIG. 4 or 18 of JP 3191653, the stepped portion would be provided in only a corner portion at which a bottom surface and a peripheral surface of the cathode metal plate meet each other.

Third Modification

Figure 7:
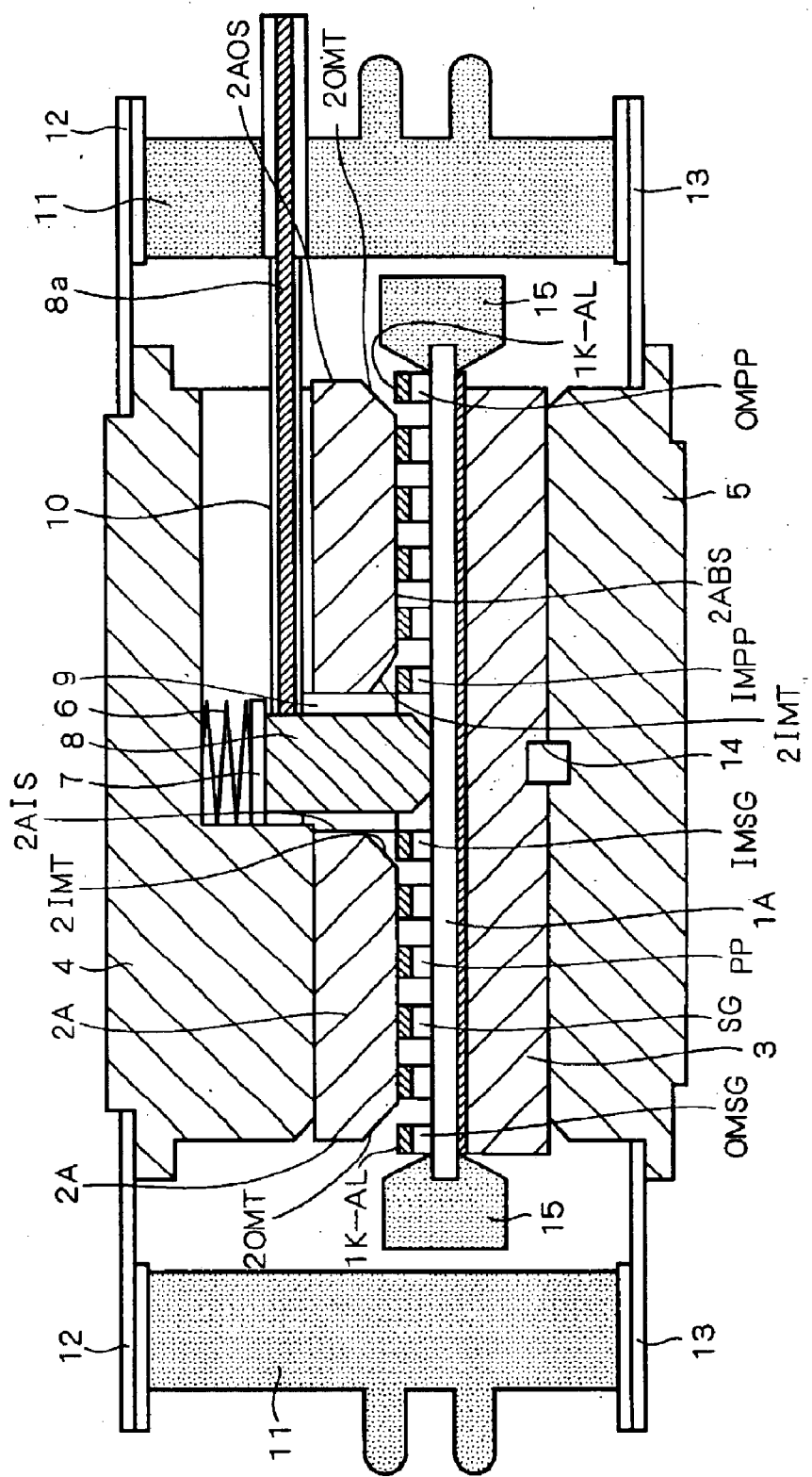
FIG. 7 is a longitudinal sectional view of a structure of a pressure contact type semiconductor device according to a third modification of the present invention.

FIG. 7 illustrates a pressure contact type semiconductor device according to a modification of the second preferred embodiment. As is illustrated in FIG. 7, the cathode strain relief plate 2A is tapered toward the bottom surface 2ABS thereof so that tapered portions 20MT and 21MT are provided in the corner portion at which the bottom surface 2ABS and the outer peripheral surface 2AOS meet each other and in the corner portion at which the bottom surface 2ABS and the inner peripheral surface 2AIS meet each other, respectively. An angle at which the cathode strain relief plate 2A is tapered toward the bottom surface 2ABS at each of the tapered portions 20MT and 21MT is determined so as to prevent the plate 2A from being brought into contact with both the cathode electrode 1K-AL on a top surface of each outermost protruding portion OMPP and the cathode electrode 1K-AL on a top surface of each innermost protruding portion IMPP, regardless of whether or not pressure contact is made.

Similarly to the structure according to the second preferred embodiment, each of the outermost and innermost segments only functions as a dummy segment through each segment has the cathode electrode 1K-AL formed thereon, in the structure according to this modification. Accordingly, the pressure contact type semiconductor device illustrated in FIG. 7 can produce the same effects as is produced by the structures according to the first and second preferred embodiments.

Alternatively, the cathode strain relief plate 2A may be configured such that the stepped portion as illustrated in FIG. 6 is provided in one of the corner portions respectively associated with the outer peripheral surface 2AOS and the inner peripheral surface 2AIS of the cathode strain relief plate 2A and the tapered portion as illustrated in FIG. 7 is provided in the other.

Moreover, the missing portion provided in the corner portion at which the bottom surface 2BS and the outer peripheral surface 2AOS or the inner peripheral surface 2AIS meet each other may have any other shape, so long as the missing portion to be provided can function to prevent the cathode strain relief plate 2A from being brought into contact with the cathode electrode 1K-AL formed on each of outermost and innermost protruding portions OMPP and IMPP.

Third Preferred Embodiment

According to the third preferred embodiment, a semiconductor substrate having the conventional structure (in which the cathode electrode 1K-AL is formed on a top face of each of the outermost and innermost protruding portions OMPP and IMPP) is utilized. However, alterations are made to respective structures of ones out of interior components used in the semiconductor device so as to allow each of outermost and innermost segments OMSG and IMSG to function as a dummy segment, thereby to attain the same effects as attained in the first preferred embodiment. More specifically, the third preferred embodiment is different from the second preferred embodiment in that, instead of providing a missing portion in a cathode strain relief plate, an outer diameter and/or an inner diameter of a cathode strain relief plate are made different from those in accordance with the conventional structure, respectively, thereby to prevent the cathode electrode 1K-AL formed on a top surface of each portion of the outermost and/or innermost protruding portions OMPP and/or IMPP from being in brought into electrical and mechanical contact with a bottom surface of the cathode strain relief plate. Below, such a structure of a cathode strain relief plate, which constitutes significant features of the third preferred embodiment, will be mainly described in detail, with reference to accompanying drawings.

Figure 8:
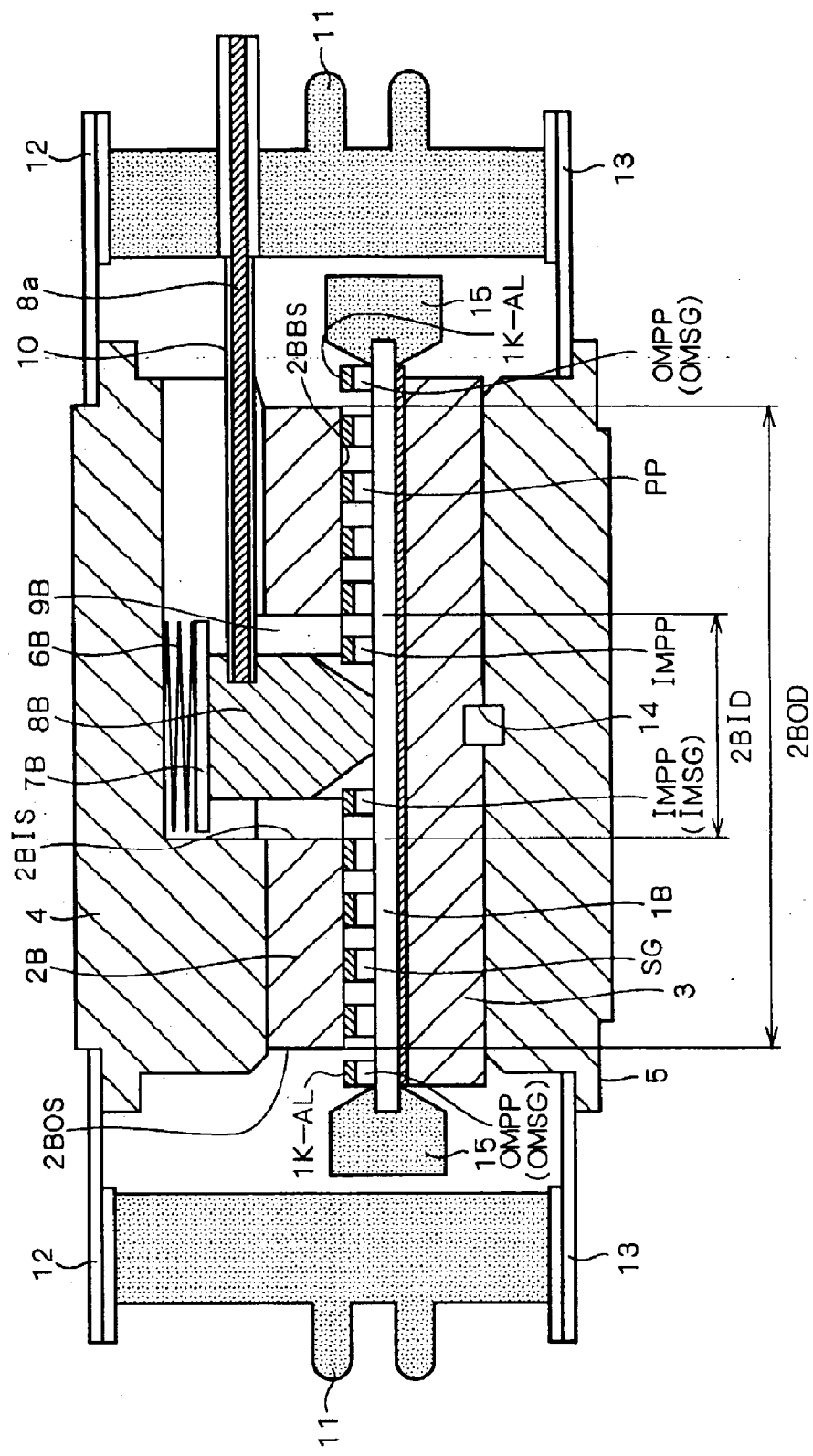
FIG. 8 is a longitudinal sectional view of a structure of a pressure contact type semiconductor device according to a third preferred embodiment of the present invention.
Figure 9:
FIG. 9 shows a profile of step heights as measured, to clarify a problem associated with a pressure contact type semiconductor device according to the background art.
Figure 10:
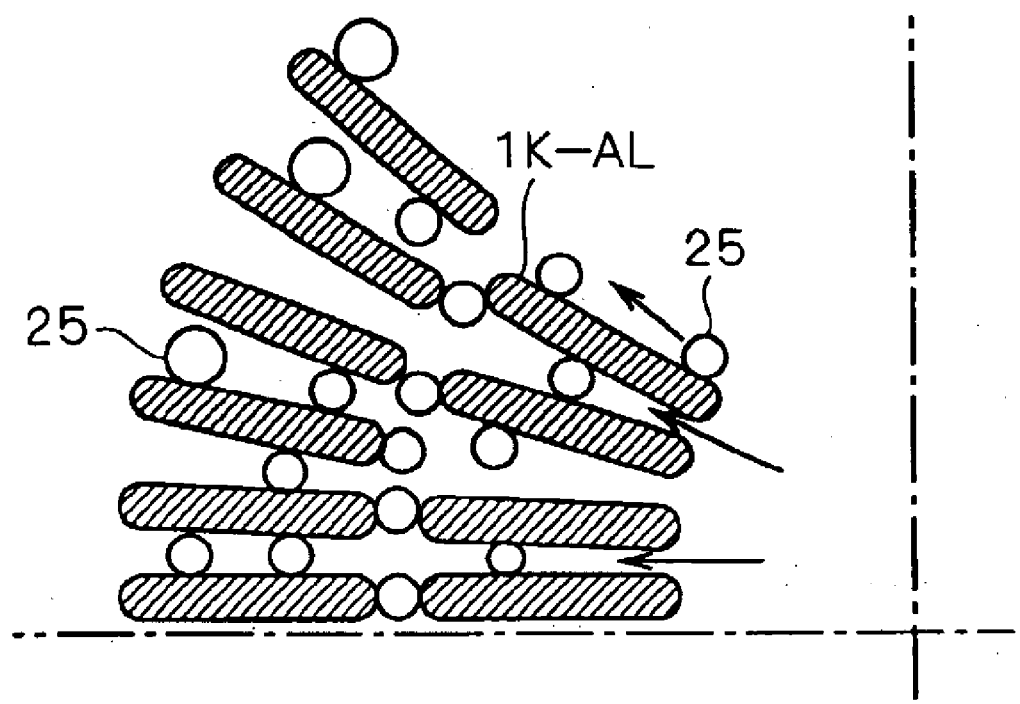
FIG. 10 is a plan view schematically illustrating a state where etching is being carried out on a semiconductor substrate, to clarify a problem associated with the pressure contact type semiconductor device according to the background art.
Figure 11:
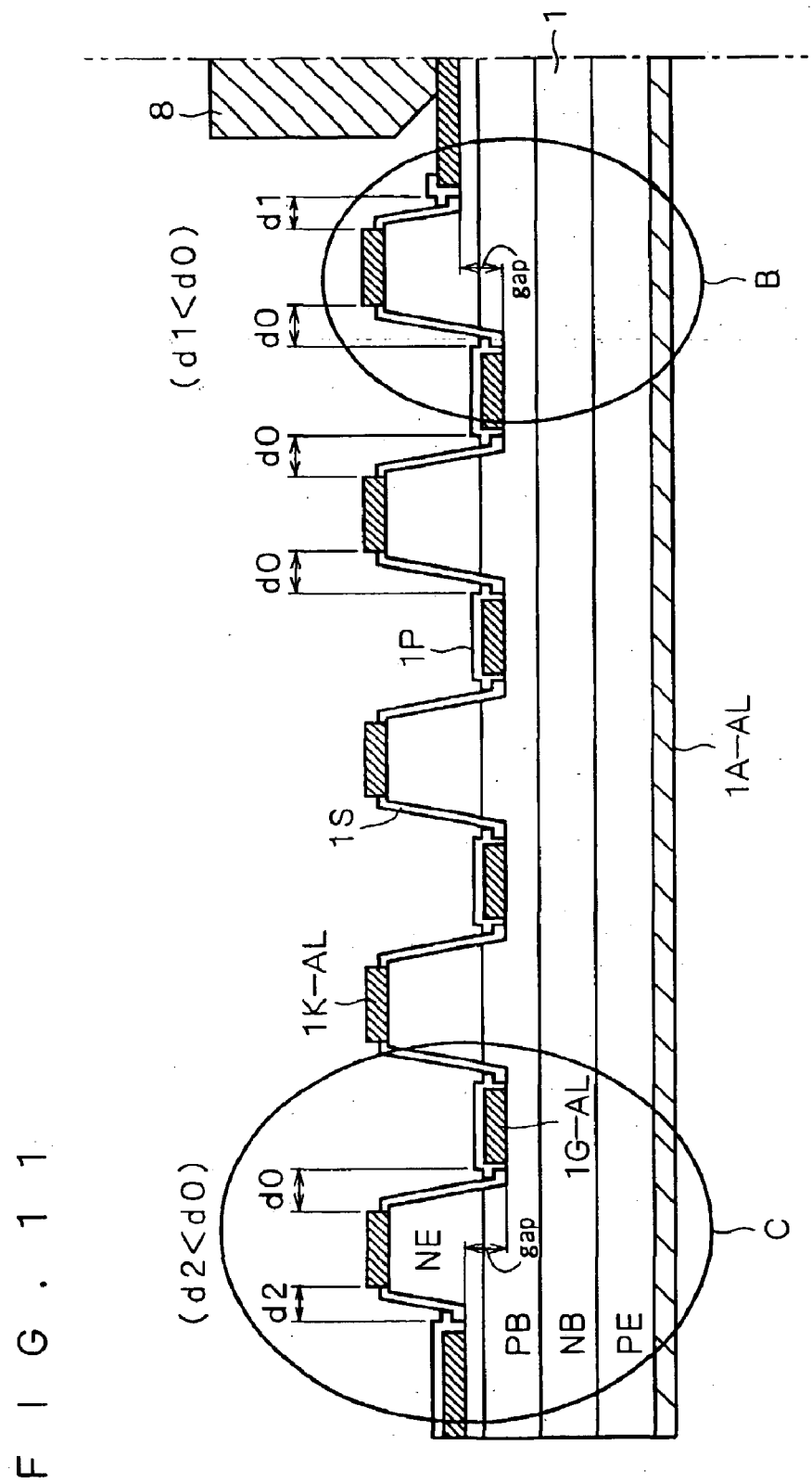
FIG. 11 is a longitudinal sectional view for showing a problem associated with the pressure contact type semiconductor device according to the background art.
Figure 12:
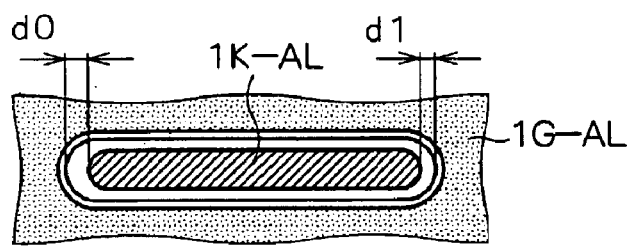
FIG. 12 is a plan view illustrating a shape of an innermost segment, to clarify a problem associated with the pressure contact type semiconductor device according to the background art.
Figure 13:
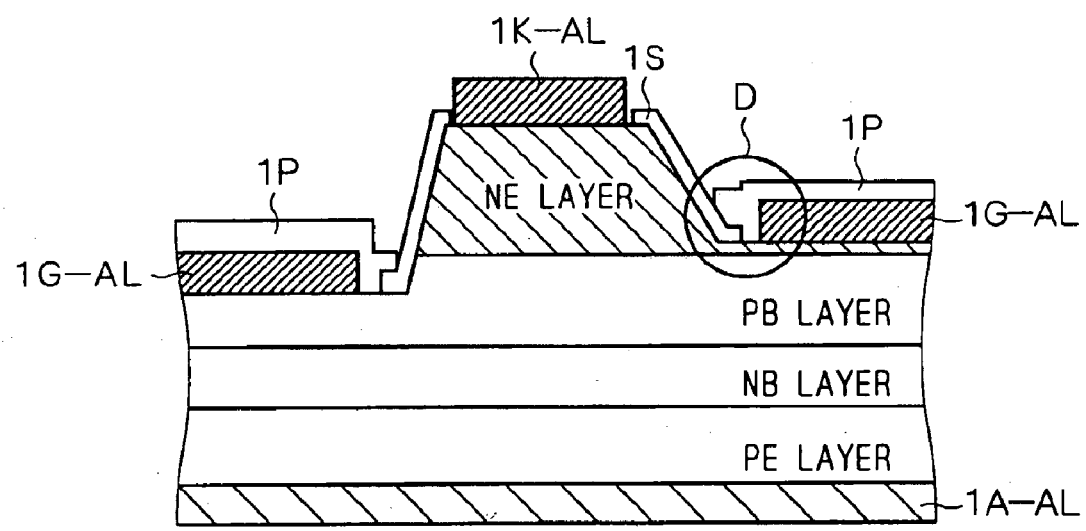

FIG. 8 is a longitudinal sectional view of a structure of a pressure contact type semiconductor device according to the third preferred embodiment. In FIG. 8, similarly to FIG. 1, a GTO thyristor of a center gate type device is illustrated as a non-limiting example of the pressure contact type semiconductor device according to the third preferred embodiment. It is noted that each component in FIG. 8 which corresponds to any one of the components in FIG. 1 is denoted by the same reference numeral, and an appropriate portion in the description of the first preferred embodiment should be referred to for detail of such element.

As illustrated in FIG. 8, the cathode electrode 1K-AL made of an aluminum film is formed on a top surface of each of the protruding portions PP in all the respective segments SG in a semiconductor substrate 1B. Moreover, an outer diameter 2BOD of a cathode strain relief plate 2B which is annular, is reduced as compared to that of the conventional cathode strain relief plate or the cathode strain relief plate 2 in the first preferred embodiment. That is to say, the outer diameter 2BOD is determined so as to prevent an outer peripheral surface 2BOS (which is circular in cross section) of the plate 2B from being brought into mechanical contact with the cathode electrode 1K-AL on each outermost protruding portion OMPP at least during pressure contact and to allow a lower edge of the outer peripheral surface 2BOS to be located between the cathode electrode 1K-AL on each outermost protruding portion OMPP and the cathode electrode 1K-AL on each of the protruding portions PP respectively disposed adjacent to the outermost protruding portions OMPP (or allow a lower edge of the outer peripheral surface 2BOS to be located over the cathode electrode 1K-AL on each of the protruding portions PP respectively disposed adjacent to the outermost protruding portions OMPP). In other words, the outer peripheral surface 2BOS, at every portion thereof, is located inner than the cathode electrode 1K-AL on each outermost protruding portion OMPP. On the other hand, the cathode strain relief plate 2B has an inner diameter 2BID which is increased as compared to that of the conventional cathode strain relief plate or the cathode strain relief plate 2 in the first preferred embodiment. Namely, the inner diameter 2BID is determined so as to prevent an inner peripheral surface 2BIS thereof from being in brought into mechanical contact with the cathode electrode 1K-AL on each innermost protruding portion IMPP at least during pressure contact and to allow a lower edge of the inner peripheral surface 2BIS to be located between the cathode electrode 1K-AL on each innermost protruding portion IMPP and the cathode electrode 1K-AL on each of the protruding portions PP respectively disposed adjacent to the innermost protruding portions IMPP (or allow a lower edge of the inner peripheral surface 2BIS to be located over the cathode electrode 1K-AL on each of the protruding portions PP respectively disposed adjacent to the innermost protruding portions IMPP). In other words, the inner peripheral surface 2BIS, at every portion thereof, is located outer than the cathode electrode 1K-AL on each innermost protruding portion IMPP. As a result of employing the cathode strain relief plate 2B having the outer diameter 2BOD and the inner diameter 2BID which are made different from those in the conventional cathode strain relief plate, components 6B, 7B, 8B and 9B which are different in size from corresponding conventional components are provided as illustrated in FIG. 8, in order to secure the external gate electrode 8B to the semiconductor substrate 1B to ensure that the external gate electrode 8B and a gate electrode extraction pattern (not illustrated) on the semiconductor substrate 1B are in mechanical contact with each other (the components 6B, 7B, 8B and 9B are made larger than corresponding conventional components, respectively).

Given the foregoing structure, it is possible to prevent the cathode electrode 1K-AL on each outermost protruding portion OMPP and the cathode electrode 1K-AL on each innermost protruding portion IMPP from being brought into mechanical and electrical contact with a bottom surface 2BBS of the cathode strain relief plate 2B during pressure contact. Hence, even if a step height created by any outermost segment OMSG or any innermost segment IMSG is made smaller than a step height created by any other segment SG during manufacture of the semiconductor substrate 1B, it is possible to employ the semiconductor substrate 1B as a product and to prevent all of the cathode electrodes 1K-AL on the outermost and innermost protruding portions OMPP and IMPP from being brought into contact with the cathode strain relief plate 2B while the cathode electrode 1K-AL is formed on each of all the protruding portions PP including the outermost and innermost protruding portions OMPP and IMPP. In the semiconductor substrate 1B, each of the outermost and innermost segments OMSG and IMSG functions as a dummy segment though each segment has the cathode electrode 1K-AL formed thereon. Accordingly, the pressure contact type semiconductor device illustrated in FIG. 8 produces the same effects as is produced by the device according to the first preferred embodiment, in operating conditions.

As an alternative to the structure illustrated in FIG. 8, only one of the outer diameter 2BOD and the inner diameter 2BID may be determined so as to establish positional relationship between the outer peripheral surface 2BOS or the inner peripheral surface 2BIS and the cathode electrodes 1K-AL as described above.

Further, the above-described structural features according to the third preferred embodiment may be applied to a GTO thyristor of a periphery gate type (a device having a structure shown in FIG. 18 of JP 3191653, for example), or a GCT thyristor (a device having a structure shown in FIG. 4 of JP 3191653, for example). It should be noted, however, that a cathode strain relief plate in each of the devices shown in FIGS. 4 and 18 of JP 3191653 is cylindrical in common, so that an inner diameter cannot exist. Accordingly, in application to the device shown in FIG. 4 or 18 of JP 3191653, only the outer diameter 2BOD would be determined to be smaller than that in the conventional structure in the above-described manner.

Variations

In the above description, it is assumed that the semiconductor substrate 1 (or 1A, 1B) has a PNPN structure. However, the present invention is not limited to such description. An NPNP structure can be employed as a structure of the semiconductor substrate, in which case the anode electrode functions as a "first main electrode" and the cathode electrode functions as a "second main electrode".

Also, a pressure contact type semiconductor device can be formed by combining the features of the first preferred embodiment with the features of the second or the third preferred embodiment, or by combining the features of the second preferred embodiment with the features of the third preferred embodiment.

Further, the annular cathode strain relief plate 2A or 2B according to the second or third preferred embodiment can be applied to a GTO thyristor of a periphery gate type device or a GCT thyristor.

While the invention has been shown and described in detail, the foregoing description is in all aspects illustrative and not restrictive. It is therefore understood that numerous modifications and variations can be devised without departing from the scope of the invention.

What is claimed is:

1. A pressure contact type semiconductor device comprising:
   a semiconductor substrate comprising a first main surface and a second main surface opposite to said first main surface;
   a first strain relief plate comprising a bottom surface which is in contact with said first main surface of said semiconductor substrate; and
   a second strain relief plate comprising a top surface which is in contact with said second main surface of said semiconductor substrate,
   wherein said semiconductor substrate includes:
   a first semiconductor layer of a first conductivity type comprising a first bottom surface and a first top surface opposite to said first bottom surface, said first bottom surface forming said second main surface of said semiconductor substrate;
   a second semiconductor layer of a second conductivity type comprising a second bottom surface and a second top surface opposite to said second bottom surface, said second bottom surface including an interface with said first top surface of said first semiconductor layer;
   a third semiconductor layer of said first conductivity type comprising a third bottom surface and a third top surface opposite to said third bottom surface, said third bottom surface including an interface with said second top surface of said second semiconductor layer; and
   a second main electrode which is formed on the whole of said first bottom surface of said first semiconductor layer and is in direct mechanical contact with said top surface of said second strain relief plate,
   a plurality of protruding portions are arranged radially and circumferentially about said semiconductor substrate on said first main surface of said semiconductor substrate,
   each of said plurality of protruding portions comprises a fourth semiconductor layer of said second conductivity type,
   said fourth semiconductor layer comprises a fourth bottom surface and a fourth top surface opposite to said fourth bottom surface, said fourth bottom surface and a corresponding region out of said third top surface of said third semiconductor layer forming a pn junction,
   said fourth top surface forms a top surface of a corresponding one out of said plurality of protruding portions;
   said pn junction is located within said corresponding one of said plurality of said protruding portions,
   a top surface of each of first protruding portions belonging to at least one group out of a first group of outermost protruding portions and a second group of innermost protruding portions is entirely covered with a first insulating layer, said outermost protruding portions located most outward in a radial direction out of said plurality of protruding portions, said innermost protruding portions located most inward in said radial direction out of said plurality of protruding portions,
   a first clearance constantly exists between a top surface of said first insulating layer and a first region of said bottom surface of said first strain relief plate which is located immediately above said top surface of said first insulating layer,
   a first main electrode is formed on a top surface of each of said plurality of protruding portions except said outermost protruding portions and said innermost protruding portions,
   said first main electrode is in direct mechanical contact with said bottom surface of said first strain relief plate,
   said first main surface of said semiconductor substrate includes an exposed surface of said fourth semiconductor layer for each of said plurality of protruding portions and exposed regions of said third top surface, and a control electrode is formed as one pattern on a region of said first main surface in which no surface of said plurality of protruding portions is included.

2. The pressure contact type semiconductor device according to claim 1, wherein a top surface of each of second protruding portions belonging to the other group out of said first group and said second group is entirely covered with a second insulating layer, and a second clearance constantly exists between a top surface of said second insulating layer and a second region of said bottom surface of said first strain relief plate which is located immediately above said top surface of said second insulating layer.

3. The pressure contact type semiconductor device according to claim 2, wherein each of said outermost and innermost protruding portions is smaller in size than any other one of said plurality of protruding portions.

4. The pressure contact type semiconductor device according to claim 2, wherein said outermost protruding portions are continuous with one another to form a single ring extending along an entire circumference of said semiconductor substrate.

5. A pressure contact type semiconductor device comprising:

a semiconductor substrate comprising a first main surface and a second main surface opposite to said first main surface;

a first strain relief plate comprising a bottom surface which is in contact with said first main surface of said semiconductor substrate; and a second strain relief plate comprising top surface which is in contact with said second main surface of said semiconductor substrate, wherein said semiconductor substrate includes:

a first semiconductor layer of a first conductivity type comprising a first bottom surface and a first top surface opposite to said first bottom surface, said first bottom surface forming said second main surface of said semiconductor substrate;

a second semiconductor layer of a second conductivity type comprising a second bottom surface and a second top surface opposite to said second bottom surface, said second bottom surface including an interface with said first top surface of said first semiconductor layer;

a third semiconductor layer of said first conductivity type comprising a third bottom surface and a third top surface opposite to said third bottom surface, said third bottom surface including an interface with said second top surface of said second semiconductor layer; and a second main electrode which is formed on the whole of said first bottom surface of said first semiconductor layer and is in direct mechanical contact with said top surface of said second strain relief plate, a plurality of protruding portions are arranged radially and circumferentially about said semiconductor substrate on said first main surface of said semiconductor substrate, each of said plurality of protruding portions comprises a fourth semiconductor layer of said second conductivity type, said fourth semiconductor layer comprises a fourth bottom surface and a fourth top surface opposite to said fourth bottom surface, said fourth bottom surface and a corresponding region out of said third top surface of said third semiconductor layer forming a pn junction, said fourth top surface forms a top surface of a corresponding one out of said plurality of protruding portions;

said pn junction is located within said corresponding one of said plurality of said protruding portions, a first main electrode is formed on a top surface of each of said plurality of protruding portions, said first main electrode which is formed on a top surface of each of first protruding portions belonging to at least one group out of a first group of outermost protruding portions and a second group of innermost protruding portions, is constantly not in mechanical contact with said bottom surface of said first strain relief plate, said outermost protruding portions located most outward in a radial direction out of said plurality of protruding portions, said innermost protruding portions located most inward in said radial direction out of said plurality of protruding portions, said first main electrode, which is formed on said top surface of each of said plurality of protruding portions, except said outermost and innermost protruding portions, is in direct mechanical contact with said bottom surface of said first strain relief plate, said first main surface of said semiconductor substrate includes an exposed surface of said fourth semiconductor layer for each of said plurality of protruding portions and exposed regions of said third top surface, and a control electrode is formed as one pattern on a region of said first main surface in which no surface of said plurality of protruding portions is included.

6. The pressure contact type semiconductor device according to claim 5, wherein said first main electrode which is formed on a top surface of each of second protruding portions belonging to the other group out of said first and second groups is constantly not in contact with said bottom surface of said first strain relief plate.

7. The pressure contact type semiconductor device according to claim 6, wherein said first strain relief plate is an annular member which comprises an inner peripheral surface and an outer peripheral surface, said first strain relief plate includes:

a first missing portion provided in a first corner portion thereof at which said bottom surface, and said outer peripheral surface of said first strain relief plate meet each other; and a second missing portion provided in a second corner portion thereof at which said bottom surface and said inner peripheral surface of said first strain relief plate meet each other, a first clearance constantly exists between said first main electrode on each of said outermost protruding portions and said first missing portion located immediately above said first main electrode on each of said outermost protruding portions, and a second clearance constantly exists between said first main electrode on each of said innermost protruding portions and said second missing portion located immediately above said first main electrode on each of said innermost protruding portions.

* * * * *